United States Patent
Negrete (10) Patent No.: US 10,197,806 B2
(45) Date of Patent: Feb. 5, 2019

(54) FABRICATION OF AIR GAP REGIONS IN MULTICOMPONENT LENS SYSTEMS

(71) Applicant: Google Inc., Mountain View, CA (US)

(72) Inventor: Omar Negrete, San Francisco, CA (US)

(73) Assignee: GOOGLE LLC, Mountain View, CA (US)

( * ) Notice: Subject to any disclaimer, the term of this patent is extended or adjusted under 35 U.S.C. 154(b) by 185 days.

(21) Appl. No.: 15/176,053

(22) Filed: Jun. 7, 2016

(65) Prior Publication Data

US 2017/0351095 A1    Dec. 7, 2017

(51) Int. Cl.
*G02B 9/00* (2006.01)
*G02B 9/08* (2006.01)
*G02B 27/01* (2006.01)
*G02B 3/00* (2006.01)
*G02B 5/00* (2006.01)
*G03F 7/00* (2006.01)
*G03F 7/20* (2006.01)
*G03F 7/32* (2006.01)

(52) U.S. Cl.
CPC ........... *G02B 27/0172* (2013.01); *G02B 3/00* (2013.01); *G02B 5/003* (2013.01); *G03F 7/0005* (2013.01); *G03F 7/2002* (2013.01); *G03F 7/32* (2013.01); *G02B 2027/0178* (2013.01); *G02B 2027/0194* (2013.01)

(58) Field of Classification Search
CPC . G02B 3/08; G02B 3/00; G02B 3/056; G02B 7/02; G02B 27/0172; G02B 5/003; B29L 2011/0016; G03F 7/0005; G03F 7/2002; G03F 7/32

See application file for complete search history.

(56) References Cited

U.S. PATENT DOCUMENTS

| | | | |
|---|---|---|---|
| 6,794,218 B2 | 9/2004 | Barton et al. | |
| 8,637,799 B2 | 1/2014 | Oku | |
| 8,885,258 B2 | 11/2014 | Matsuno et al. | |
| 9,213,178 B1 | 12/2015 | Giri et al. | |
| 2008/0136956 A1 | 6/2008 | Morris et al. | |
| 2009/0147368 A1 | 6/2009 | Oh et al. | |
| 2011/0292271 A1 | 12/2011 | Lin et al. | |
| 2013/0037976 A1* | 2/2013 | Hayashida | B29D 11/00298 264/1.7 |

FOREIGN PATENT DOCUMENTS

WO    WO 2006/136935    12/2006

OTHER PUBLICATIONS

Examination Report dated May 22, 2017, for European Application No. GB1620956.1, 6 pages.

(Continued)

*Primary Examiner* — Alicia M Harrington (57) ABSTRACT

Embodiments regard fabrication of air gap regions in multicomponent lens systems. An embodiment of an apparatus includes a first lens, the first lens including a pattern of photoresist material; a second lens bonded with the first lens by the photoresist material; and an air gap region between the first lens and the second lens. The photoresist pattern defines the air gap region between the first lens and the second lens.

19 Claims, 12 Drawing Sheets

(56) References Cited

OTHER PUBLICATIONS

PCT/US2016/065006—International Search Report and Written Opinion, dated Apr. 4, 2017, 16 pages.
Translation of First Office Action dated May 17, 2017 correlating to Patent Application No. CN20161413287.1, 4 pages.
International Preliminary Report on Patentability dated Jun. 20, 2018 for corresponding International Application No. PCT/US2016/065006, 11 pages.

* cited by examiner

FABRICATION OF AIR GAP REGIONS IN MULTICOMPONENT LENS SYSTEMS

TECHNICAL FIELD

This disclosure relates generally to optical components, and in particular but not exclusively, relates to fabrication of air gap regions in multicomponent lens systems.

BACKGROUND INFORMATION

The fabrication of air gap regions between optical components of a multicomponent lens system can be important in many optical applications. Air gap interfaces provide low index of refraction volumes that may serve as the cladding for total-internal-reflection in embedded light-guide optics.

However, application of this integration of components has been limited because conventional processes require the utilization of low refractive index adhesives. Such adhesives are expensive, require complex processing, and have difficult mechanical properties for lens processing.

More specifically, the definition of an air gap in a specific region on a lens system requires that the bonding media be patterned and excluded from the air gap region. Because the adhesive is applied in liquid form, it is not easily controlled spatially, thus complicating the fabrication process for a lens system

BRIEF DESCRIPTION OF THE DRAWINGS

Non-limiting and non-exhaustive embodiments of the invention are described with reference to the following figures, wherein like reference numerals refer to like parts throughout the various views unless otherwise specified. The drawings are not necessarily to scale, emphasis instead being placed upon illustrating the principles being described.

DETAILED DESCRIPTION

Embodiments of an apparatus, system, and process for fabricating air gap regions in multicomponent lens systems.

In the following description numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used herein, the following definitions apply:

"Photoresist" or "resist" refers to a light sensitive material that may be applied to form a patterned coating on a surface.

"Negative-tone photoresist" or "negative photoresist" refers to a photoresist for which exposed photoresist (a portion of the photoresist that is exposed to light) is insoluble by a particular photoresist developer, and unexposed photoresist (a portion of the photoresist that is not exposed to light) is soluble by the photoresist developer. An example of a negative photoresist is SU-8 photoresist, a commonly used epoxy-based negative photoresist that is dissolved in a particular organic solvent.

"Positive-tone photoresist" or "positive photoresist" refers to a photoresist for which exposed photoresist (a portion of the photoresist that is exposed to light) is soluble by a particular photoresist developer, and unexposed photoresist (a portion of the photoresist that is not exposed to light) is insoluble by the photoresist developer.

In the fabrication of multi-component lenses, the creation of air gaps or voids between the lens components is an important process to provide low index of refraction volumes. The low index of refection volumes may, for example, serve as the cladding for total-internal-reflection in embedded light-guide optics. Implementations may include, but are not limited to, head-worn display optics for smart glass or virtual reality products. The concept of air gaps or voids may include maintenance of total internal reflection in a wave guide.

A major reason for the generation of an air gap is the index of refraction required for light-guide optics to function. The surrounding area of light-guide must be of considerably lower index of refraction. Thus, a desirable solution is for the light-guide to operate in air where the index of refraction is 1.

However, conventional processes to provide integration of lenses into a lens assembly utilize low refractive index adhesives, which are difficult to apply and control, requiring sophisticated bonding, alignment, and dispensing of the optical adhesives. Conventional optical bonding requires pressure and either thermal or light radiation to fix the adhesive to the optical component surfaces. Fabrication using such adhesive construction is a well-defined process for standard compound optical systems. However, to introduce off-axis embedded light-guide optics, the fabrication process utilizing conventional adhesives becomes much more complex.

In some embodiments, an apparatus, system, or method provides for generation of air gap regions while eliminating the need for conventional adhesive application and the advanced equipment that is needed for the adequate process control of conventional adhesives. In some embodiments, an apparatus, system, or method employs a photoresist process to both define the air gap region and to bond lens components via photoresist-plastic interfaces. In some embodiments, a photoresist, for example a negative-tone photoresist, is utilized as both a structural component and binding material for optical components.

The utilization of photoresist construction of lens assemblies enables the fabrication of thin and light assemblies. For example, fabrication of a lens assembly utilizing photoresist construction may be specifically useful for the fabrication of head-worn display technology where thin and ophthalmic form factors are desired.

Photoresist is a material that can be uniformly applied to a surface and deterministically patterned through photolithography. This material is common in the microchip industry, where photoresist defines the placement devices or features. For example, transistors in integrated circuits or channels microfluidics are patterned into photoresist and finally etched into their respective substrates. The photoresist is then discarded by dissolution in etchant, leaving behind a patterned substrate.

In some embodiments, a generated photoresist pattern is permanent in an apparatus or system, the material becoming part of a final lens system. The ability to pattern photo material allows highly accurate (for example <0.5 micron (micrometers)) air gap definition, which is generally beyond the required precision for the definition of an air gap region.

In some embodiments, a negative-tone photoresist is applied to one or more lenses, wherein photoresist material that is exposed to light is cross linked and made permanent, and areas of the material that are not exposed to light are not cross linked and can be dissolved in the appropriate photoresist developer. In contrast, a positive-tone photoresist behaves in the opposite way, wherein areas exposed to light are dissolvable in developer and areas not exposed to light remain intact.

In some embodiments, a process for defining an air gap region utilizing photoresist bonding is both simpler and more precise in comparison with conventional processes. Further, much of the required processes, hardware, and chemistry for the generation of a lens assembly in an embodiment may be obtained commercially or easily manufactured. As a result, an implementation allows for low cost production, precise air gap definition, and applicability to a variety of embedded light-guide designs.

In some embodiments, alternative implementations may include additional adhesives or photoresist to support the bonding of the light-guide/support lens interface. In some embodiments, there may be further variation in the activation of bonding areas via chemical, thermal, or electrical treatments as appropriate for the particular photoresist material and lens material.

Figure 1:
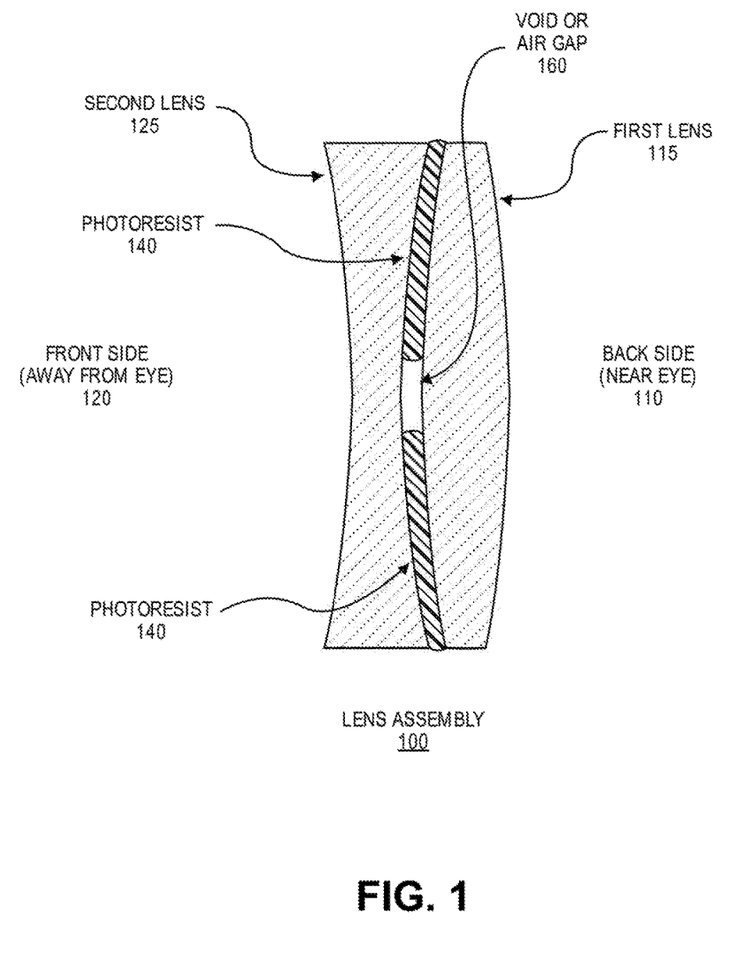
FIG. 1 is an illustration of a lens assembly according to an embodiment.

FIG. 1 is an illustration of a lens assembly according to an embodiment. In some embodiments, a lens assembly 100 includes a combination of at least two lens, illustrated as a first lens 115 (also referred to as a back lens or eye lens) on a back side 110 (near the eye of a user of the lens assembly) of the lens assembly and a second lens 125 (also referred to as a front lens or world lens) located on a front side 120 (further away from the eye of the user) of the lens assembly 100.

Figure 4A:
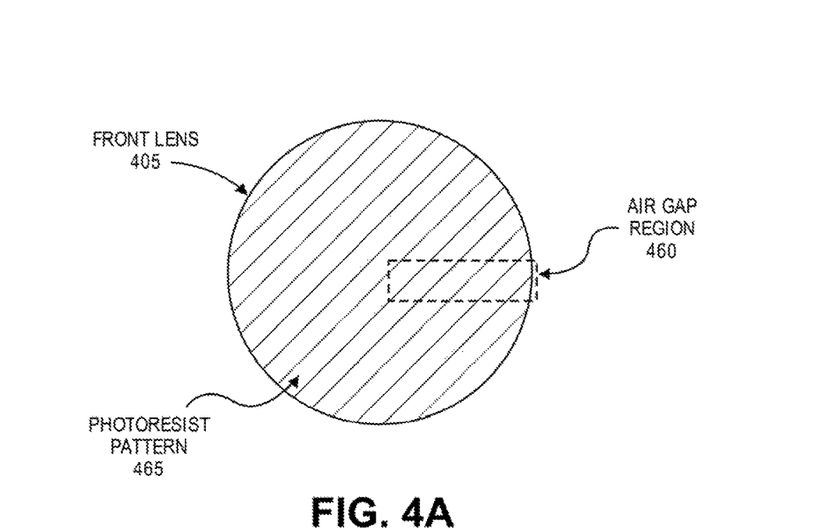
FIGS. 4A and 4B are illustrations of lens assemblies with air gaps generated utilizing photoresist patterns according to an embodiment.
Figure 4B:
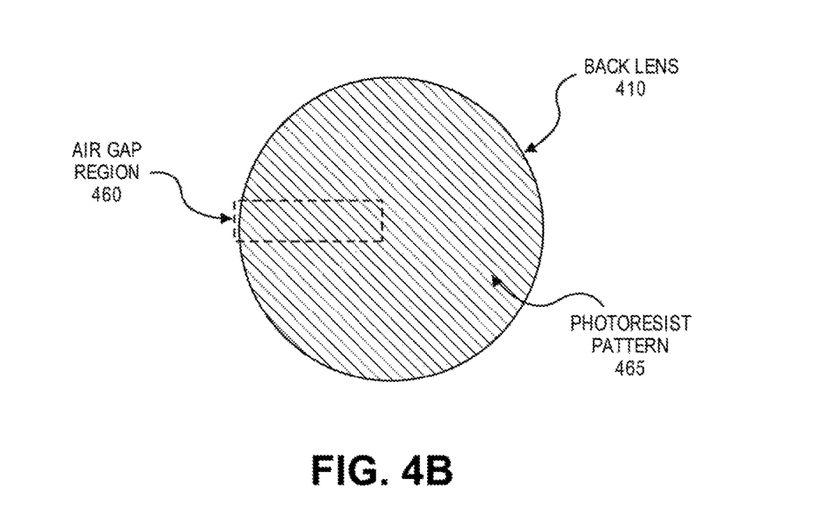

In some embodiments, the first lens 115 and second lens 125 of the lens assembly are bonded together through use of photoresist 140 to create an air gap region 160. In some embodiments, the photoresist operates to both define the air gap region 160 and to bond lens components 115 and 125 via photoresist-plastic interfaces. The air gap region may be, for example, in the form of air gap 460 as illustrated in FIGS. 4A and 4B.

Figure 2A:
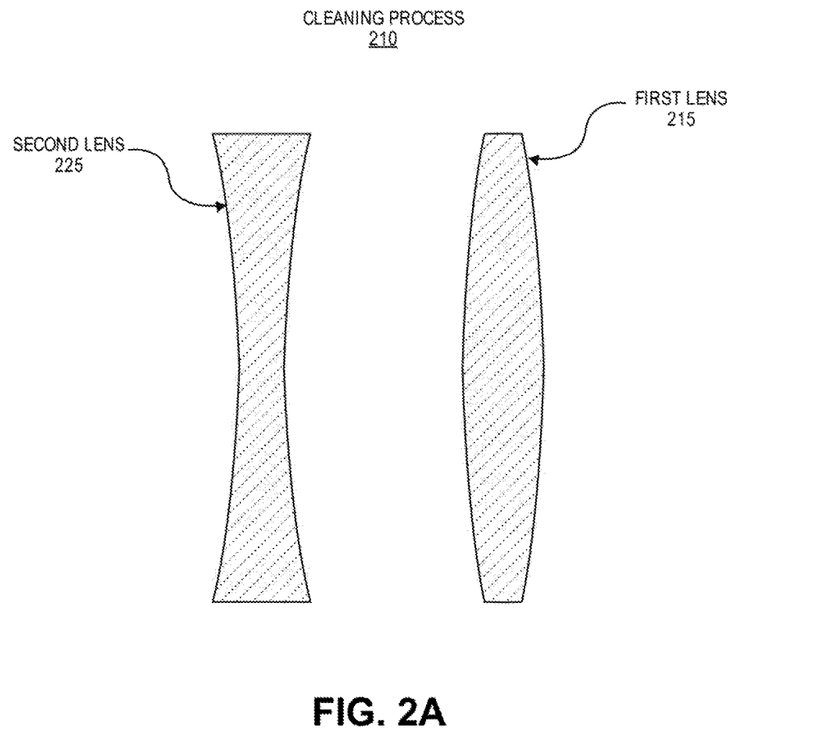
FIG. 2A illustrates initial processing in the fabrication of a lens assembly according to an embodiment.

FIGS. 2A through 2F provides illustrations relating to the fabrication of a lens assembly:

FIG. 2A illustrates initial processing in the fabrication of a lens assembly according to an embodiment. In some embodiments, a process for fabrication may include a cleaning process for the lens elements to be combined into a lens assembly. For example, two or more components that make up a lens assembly are washed and dehydrated, and which may further be plasma primed. In a particular example a lens assembly is composed of first part (or first lens component) 215 and a second part (or second lens component) 225. In this example, the first part is a light-guide lens, wherein the first part is to be located on a back side of a lens assembly, or near the eye of a user. Further in this example, the second part is a support lens, the second part to be located on a front side of a lens assembly or away from eye. However, embodiments are not limited to a particular number of lens components, and may include any number of two or more lens components.

Figure 2B:
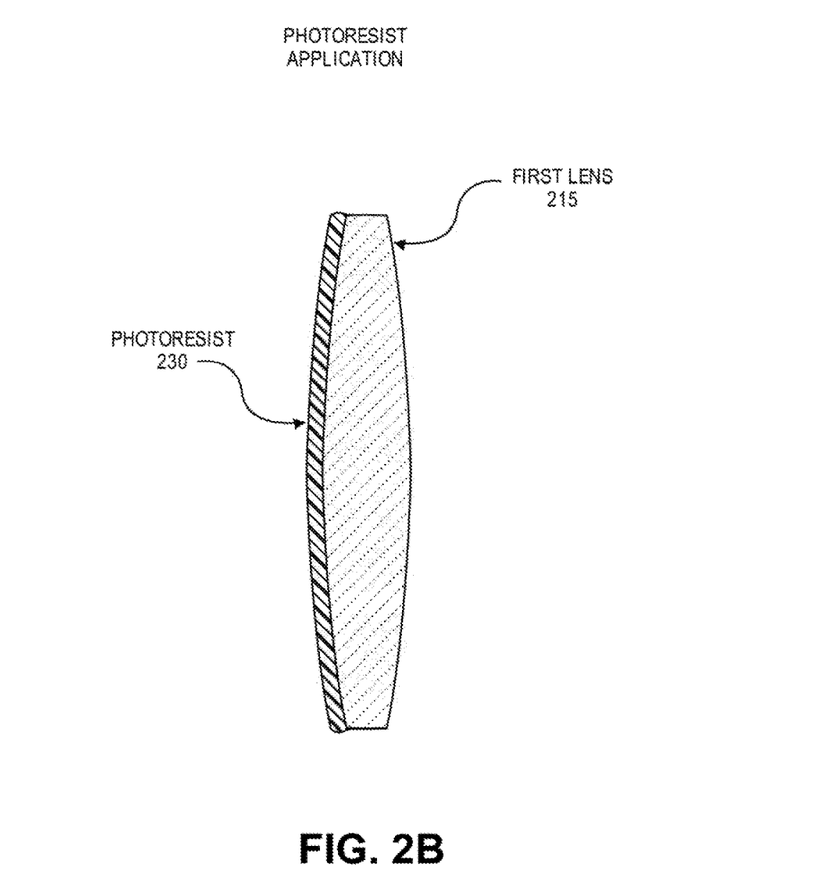
FIG. 2B illustrates photoresist application in the fabrication of a lens assembly according to an embodiment.

FIG. 2B illustrates photoresist application in the fabrication of a lens assembly according to an embodiment. In some embodiments, a process for fabrication may include photoresist application to at least one side of one lens of a lens assembly. In some embodiments, the photoresist is a negative tone photoresist. In this implementation, the negative tone photoresist is uniformly coated (via, for example, spin, spray, or dip coating). However, embodiments are not limited to application processes providing uniform or complete coating with photoresist material. In additional embodiments photoresist may be applied to multiple lenses for the purpose of joining such lenses together.

In a particular example, a negative photoresist coating 230 is applied on a convex side of a light-guide lens (back side), illustrated as first lens 215. In some embodiments, a thickness of the coating 230 determines a height of an air gap for a resulting lens assembly, wherein the thickness may generally be between 1 micron and 50 microns.

In some embodiments, the one or more lens to which the photoresist coating is applied may be further processed as required, for example a pre-exposure bake that is applied to drive off excess solvents or similar processes per a particular manufacturer's recommendation. However, embodiments are not limited to particular operations required for handling of photoresist.

Figure 2C:
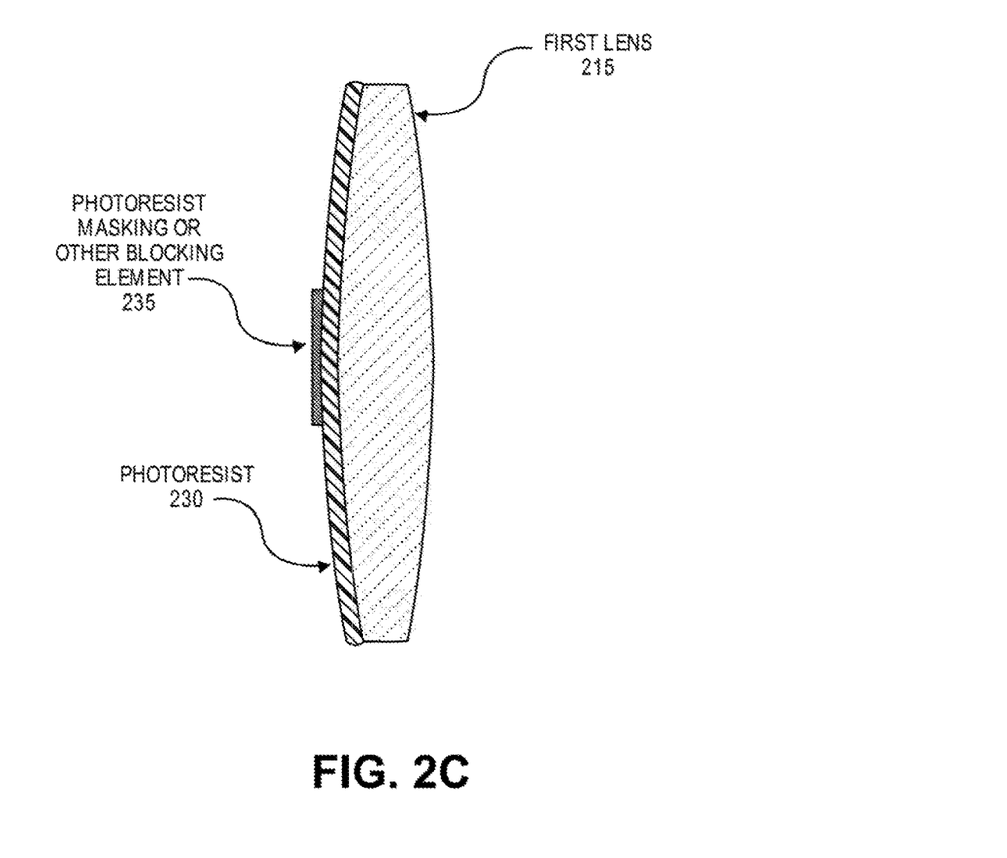
FIG. 2C illustrates spatial modulation of light in the fabrication of a lens assembly according to an embodiment.

FIG. 2C illustrates spatial modulation of light in the fabrication of a lens assembly according to an embodiment. In some embodiments, a process for fabrication may include spatial modulation of light to direct exposure to desired portions of a photoresist coating. In some embodiments, spatial modulation may include, but is not limited to, masking areas of photoresist to allow desired portions to receive light exposure to define the air gap region in a lens assembly.

In a particular example of a negative photoresist coating application, as illustrated in FIG. 2B, an area to be defined as the air gap region is masked off by, for example, aluminum plated tape, physical quartz mask, or other UV-absorbing material for photolithography on or above the photoresist coated light-guide lens. In an example, photoresist masking or other blocking element 235 may be utilized as shown in FIG. 2C. Embodiments are not limited to a specific process of photolithography, but may, for example, include contact, proximity, or projection photolithography.

Figure 2D:
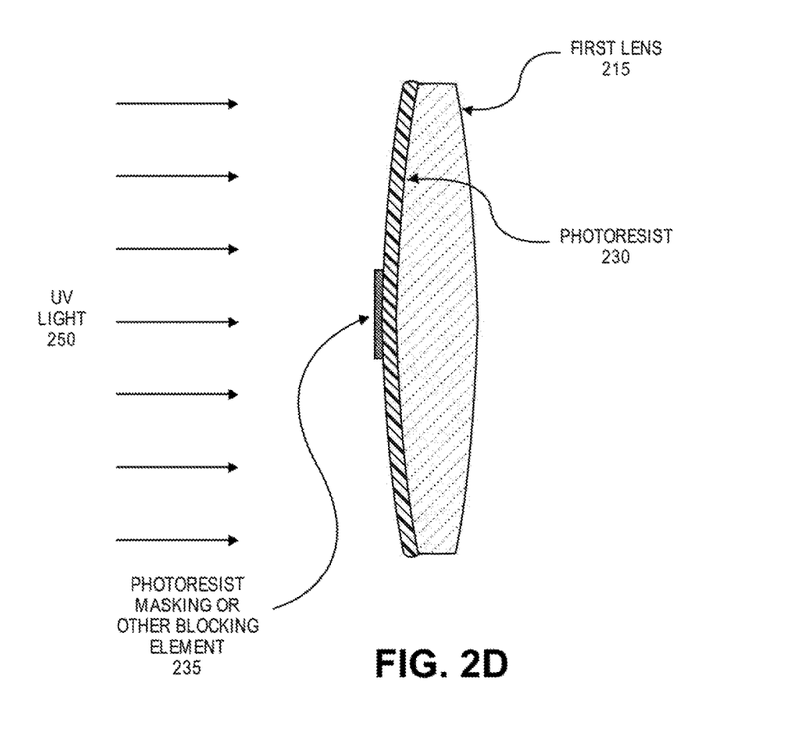
FIG. 2D illustrates photolithography in the fabrication of a lens assembly according to an embodiment.

FIG. 2D illustrates photolithography in the fabrication of a lens assembly according to an embodiment. In some embodiments, a process for fabrication may include photolithography to expose portions of photoresist. In some embodiments, a first lens 215, for example a light-guide lens, is exposed to light, for example UV/i-line (ultraviolet, wherein i-line refers to 365 nm (nanometer) wavelength)) radiation 250 to cross-link the photoresist in the non-masked regions, i.e., regions that are not masked by the photoresist masking or other blocking element 235. However, embodiments are not limited to a particular wavelength exposure, with the radiation wavelength being dependent on the particular photoresist material.

Figure 2E:
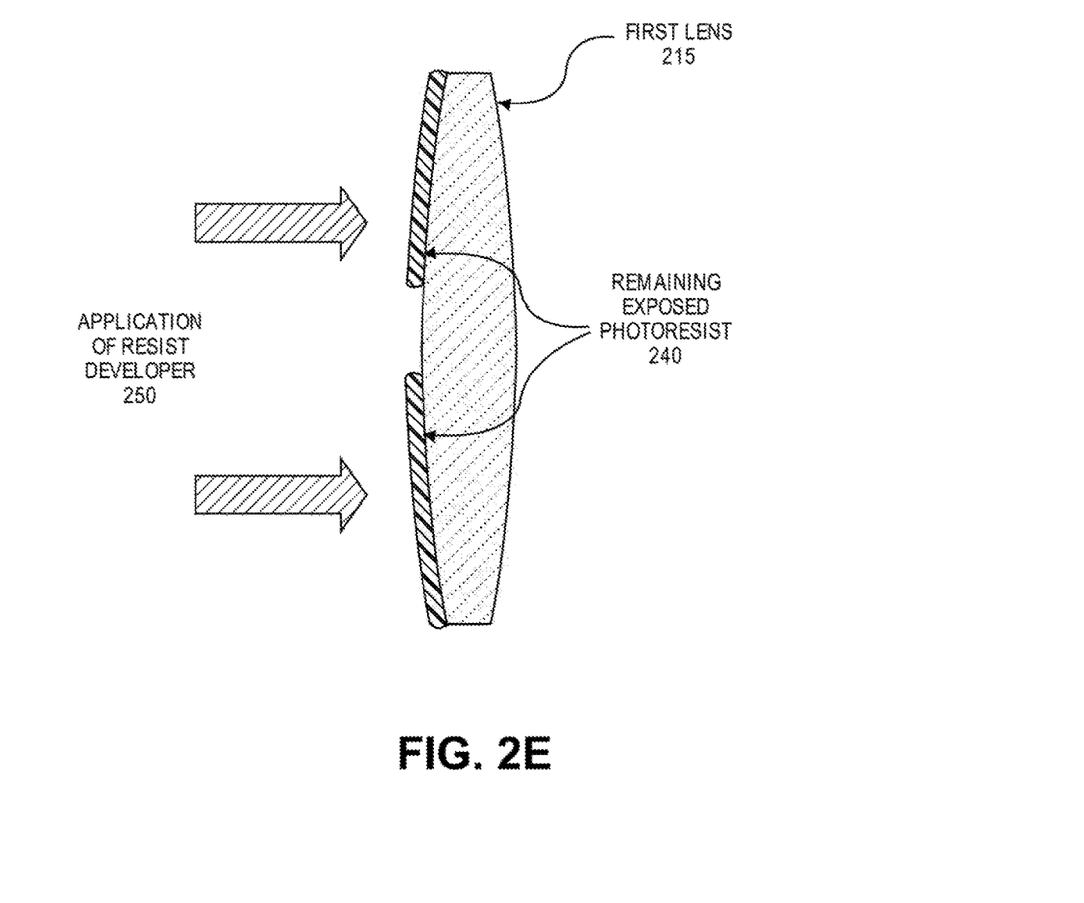
FIG. 2E illustrates photoresist developer application in the fabrication of a lens assembly according to an embodiment.

FIG. 2E illustrates photoresist developer application in the fabrication of a lens assembly according to an embodiment. In some embodiments, subsequent to radiation exposure, the masking 235 (if used to provide spatial modulation of radiation) of a first lens 215 is removed. In some embodiments, photoresist developer 250 is then applied to the first lens 215, the application of photoresist developer to dissolve certain portions of photoresist and retain a photoresist pattern.

In some embodiments, the first lens 215 may be post-exposure baked (for example, at a temperature of approximately 65 degrees Celsius), or may be directly developed in a manufacturer's suggested developer. Upon application of the photoresist developer, areas of the photoresist that were exposed to the UV radiation will remain on the lens 215, and areas of the photoresist that were protected from exposure by masking or other spatial modulation of explosion will dissolve and be completely removed. The lens with the remaining photoresist pattern may then be washed and dried.

Figure 2F:
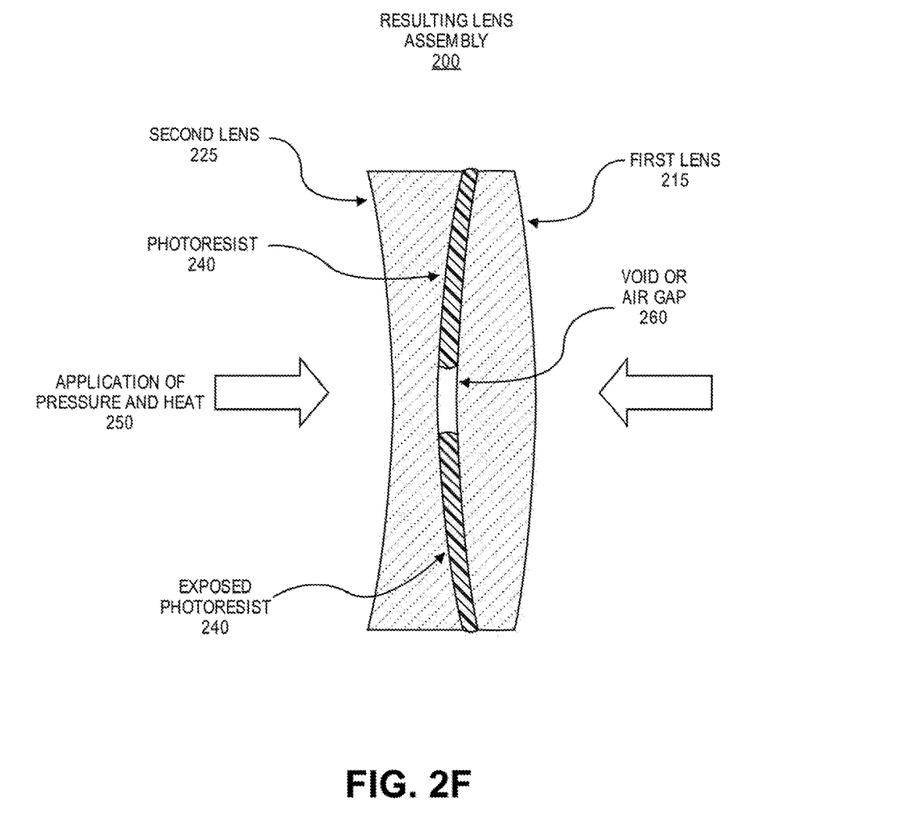
FIG. 2F illustrates lens bonding in the fabrication of a lens assembly according to an embodiment.

FIG. 2F illustrates lens bonding in the fabrication of a lens assembly according to an embodiment. In some embodiments, a process for fabrication may include bonding of lens using a remaining photoresist pattern after photoresist developer application, as illustrated in FIG. 2E. In some embodiments, a second lens 225, which may be cleaned and plasma primed as described in connection with FIG. 2A, may be combined with the first lens 215. In some embodiments, a surface of the second lens 225, for example a concave surface of such lens, is placed in direct contact with a surface of the first lens 215, for example a convex surface of the first lens 215.

In some embodiments, the lenses are then bonded together through, for example, a vacuum bake to apply pressure and heat 250. Use of vacuum bags or bladders can be applied to impart uniform pressure about the entire surface of the lens. Critical parameters for the bonding of the lens utilizing the adhesion of the photoresist include pressure, temperature, and time, which may be optimized for the particular photoresist, thus enabling the two lenses to become bonded into a lens assembly or lens unit 200. In some embodiments, the resulting lens assembly 200 includes a void or air gap 260 that is defined by the positioning and thickness of the photoresist pattern of the exposed photoresist 240.

In some embodiments, the resulting lens assembly 200 then may, for example, be allowed to cool, for example cooling at room temperature, and cleaned if required. In some embodiments, additional processes may be applied to provide for proper curing of the photoresist. Embodiments are limited to particular processes for the curing of the photoresist, but rather will include processes that are appropriate for the particular photoresist material.

Figure 3A:
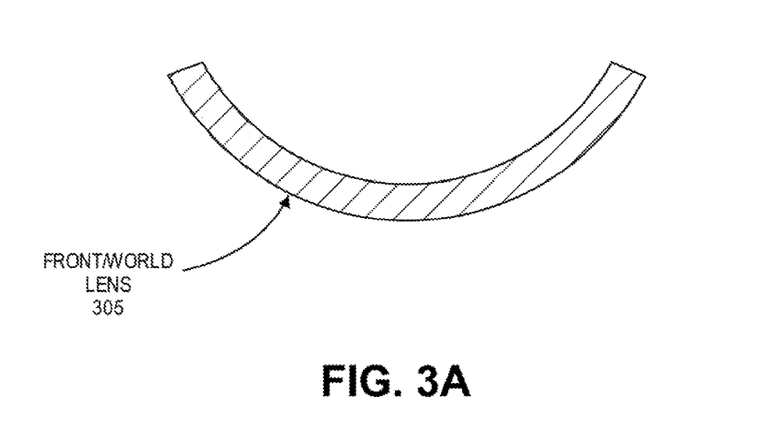
FIG. 3A illustrates a front lens for fabrication of a lens assembly according to an embodiment.
Figure 3B:
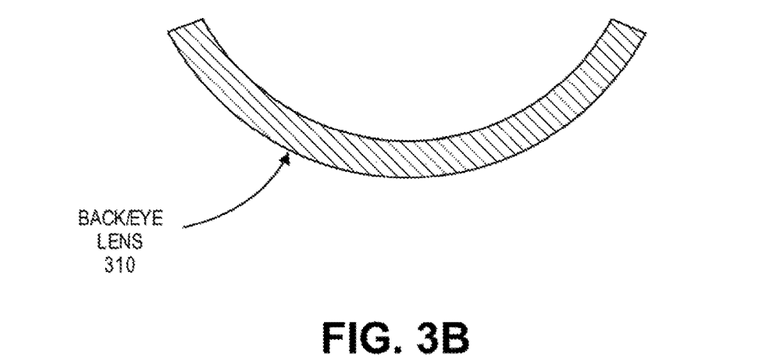
FIG. 3B illustrates a back lens for fabrication of a lens assembly according to an embodiment.

FIGS. 3A through 3F provide additional illustrations relating to the fabrication of a lens assembly:

FIG. 3A illustrates a front lens for fabrication of a lens assembly according to an embodiment. FIG. 3B illustrates a back lens for fabrication of a lens assembly according to an embodiment. In some embodiments, the fabrication of a lens assembly includes the bonding of two or more lens components, such a front (world) lens 305 and a back (eye) lens 310. In some embodiments, the fabrication of the lens assembly generates an air gap, for example an air gap to provide a light-guide for the back lens 310.

Figure 3C:
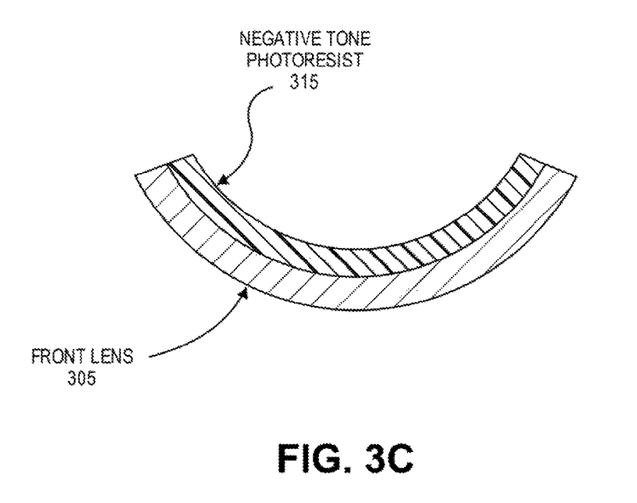
FIG. 3C illustrates application of a photoresist coating in the fabrication of a lens assembly according to an embodiment.
Figure 3D:
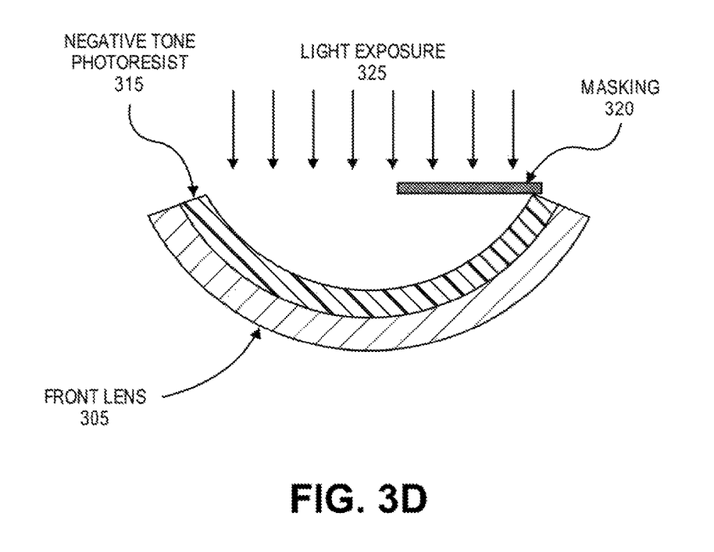
FIG. 3D illustrates spatial modulation of light with a masking element in the fabrication of a lens assembly according to an embodiment.

FIG. 3C illustrates application of a photoresist coating in the fabrication of a lens assembly according to an embodiment. In some embodiments, a negative tone photoresist 315 is applied to the front lens, for example a negative tone photoresist coating applied by a spin coat or spray of photoresist material. FIG. 3D illustrates exposure of a photoresist coating in the fabrication of a lens assembly according to an embodiment. In some embodiments, the negative tone photoresist 315 is masked by one or more masking elements 320, and the portions of the photoresist 315 that are not masked are exposed to light 325.

Figure 3E:
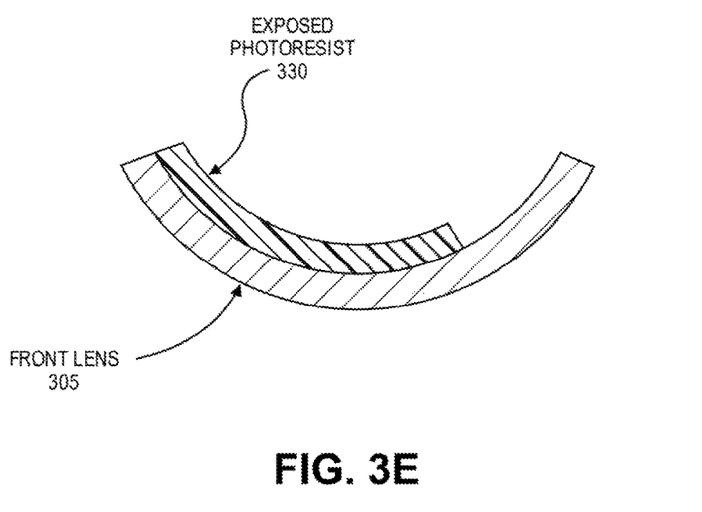
FIG. 3E illustrates a lens including remaining exposed photoresist for a lens assembly according to an embodiment.

FIG. 3E illustrates a lens including remaining exposed photoresist for a lens assembly according to an embodiment. In some embodiments, a photoresist developer is applied to the front lens 305, resulting in removal of the unexposed portions of the negative tone photoresist, with exposed photoresist 330 remaining on the surface of the front lens 305.

Figure 3F:
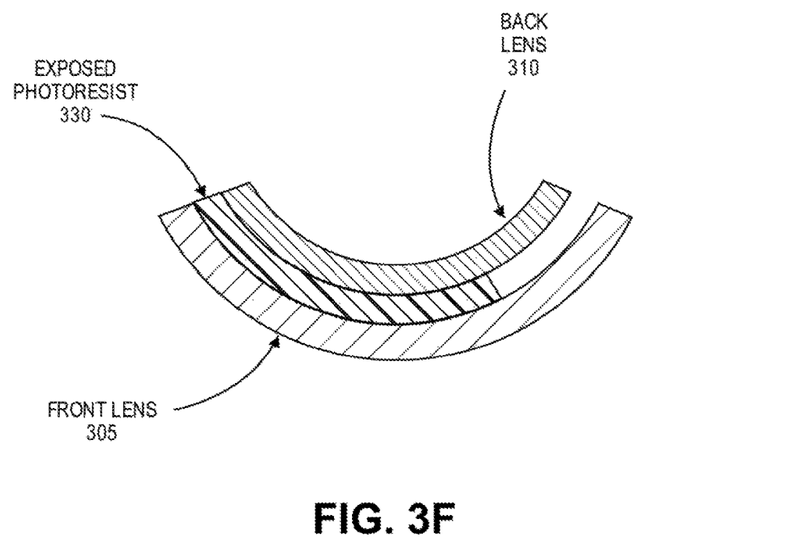
FIG. 3F illustrates lens bonding in the fabrication of a lens assembly according to an embodiment.

FIG. 3F illustrates lens bonding in the fabrication of a lens assembly according to an embodiment. In some embodiments, the back lens 310 is bonded with the front lens 305 utilizing the exposed photoresist with the application of heat and pressure to generate plasma activation. In some embodiments, the bonding of the lens it to generate an air gap as defined by the photoresist pattern.

FIGS. 4A and 4B are illustrations of lens assemblies with air gaps generated utilizing photoresist patterns according to an embodiment. In some embodiments, a photoresist pattern is generated by a process including coating a lens with a photoresist; applying light radiation to areas that are not protected from the radiation by masking or other spatial modulation of the radiation; and application of photoresist developer to dissolve portions of the photoresist that are not intended for a photoresist pattern for bonding of two or more lens components and generation of an air gap or void between such lens components.

FIGS. 4A and 4B illustrate views of lens assemblies including air gaps generated utilizing patterns for photoresist in a lens assembly. In a first example, FIG. 4A illustrates a top down view of a front (world) lens 405 of a lens assembly including a photoresist pattern to generate an air gap region 460. In a second example, FIG. 4B illustrates a top down view of a back (eye) lens 410 including a photoresist pattern to generate an air gap region 460. In some embodiments, the photoresist pattern 465 in FIGS. 4A and 4B may include the remaining portion of the surface of each lens excluding the air gap region 460. The air gap region 460 may be generated for use in, for example, a light-guide implementation. However, embodiments are not limited to a particular photoresist pattern, but rather may include any designed photoresist pattern that provides for bonding of lens of a lens assembly and provides any needed gap for the particular implementation.

Figure 5:
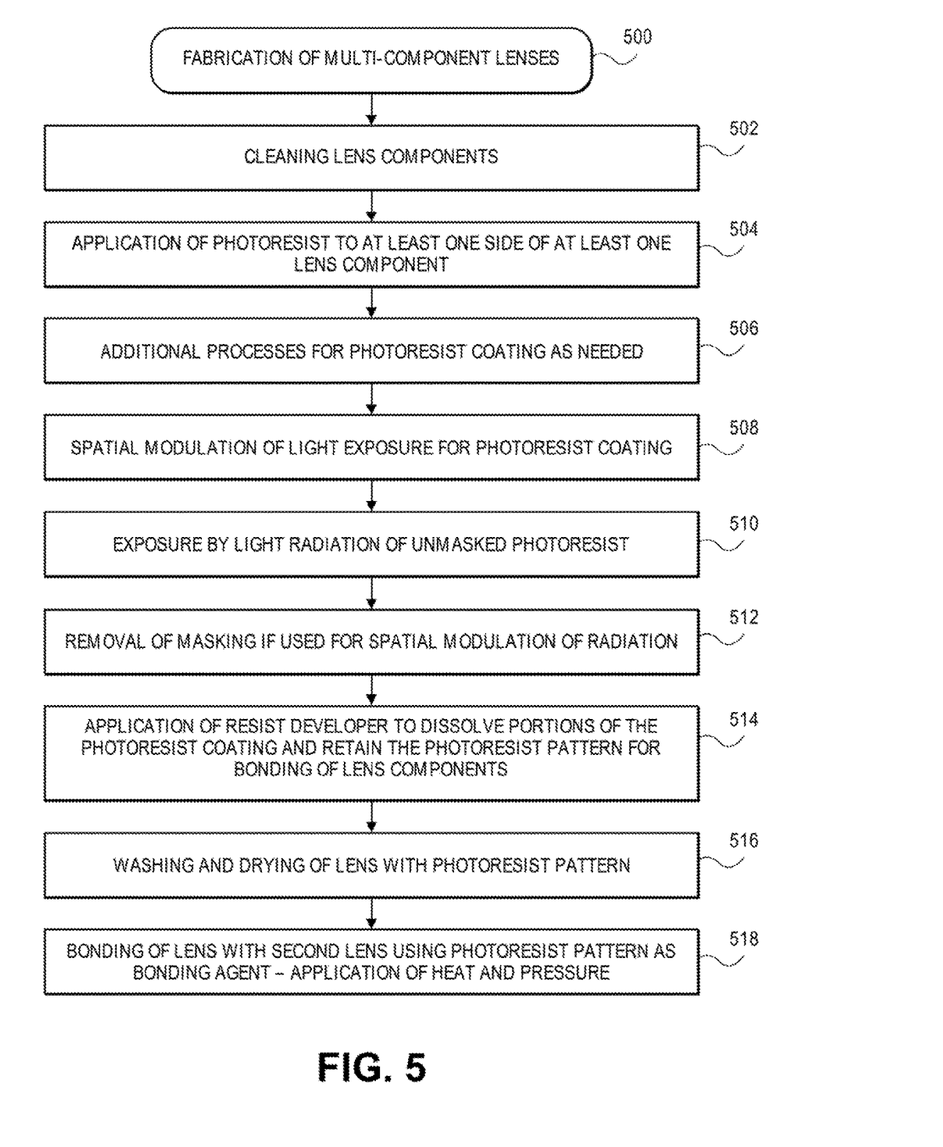
FIG. 5 is an illustration of a process for fabrication of multi-component lenses according to an embodiment.

FIG. 5 is an illustration of a process for fabrication of multi-component lenses according to an embodiment. In some embodiments, a process 500 includes:

502: Cleaning of two or more lens components, wherein lens components include at least a first lens component and a second lens component.

504: Application of photoresist coating on at least one side of at least one lens component, including application of photoresist to a first side of a first lens component. In an example, a negative photoresist coating is applied. A thickness of the applied photoresist coating is a defining factor for a height of a void or air gap between the lens components.

506: Additional processes for the photoresist coating as required for the photoresist material, for example, baking to remove excess solvents.

508: Spatial modulation of light exposure, for example UV radiation, applied to the photoresist coating. In one example, the spatial modulation may include, but is not limited to, masking of areas to establish the required photoresist pattern.

510: Exposure of unmasked portion of photoresist coating by UV radiation or other light radiation as required for the photoresist material.

512: Removal of masking material if the spatial modulation includes the use of masking material.

514: Application of applicable photoresist developer for the photoresist material to dissolve certain portions of the photoresist coating and retain the photoresist pattern, for example, with a negative photoresist, dissolving portions of the photoresist coating that were not exposed to UV radiation.

516: Washing and drying of lens with resulting photoresist pattern.

518: Bonding of lens with second lens using photoresist pattern as bonding agent, which may include application of heat and pressure to provide bonding action.

The processes explained above are described in terms of computer software and hardware. The techniques described may constitute machine-executable instructions embodied within a tangible or non-transitory machine (e.g., computer) readable storage medium, that when executed by a machine will cause the machine to perform the operations described. Additionally, the processes may be embodied within hardware, for example an application specific integrated circuit (ASIC) or otherwise.

A tangible machine-readable storage medium includes any mechanism that provides (i.e., stores) information in a non-transitory form accessible by a machine (e.g., a computer, network device, personal digital assistant, manufacturing tool, any device with a set of one or more processors, etc.). For example, a machine-readable storage medium includes recordable/non-recordable media (e.g., read only memory (ROM), random access memory (RAM), magnetic disk storage media, optical storage media, flash memory devices, etc.).

The above description of illustrated embodiments of the invention, including what is described in the Abstract, is not intended to be exhaustive or to limit the invention to the precise forms disclosed. While specific embodiments of, and examples for, the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific embodiments disclosed in the specification. Rather, the scope of the invention is to be determined entirely by the following claims, which are to be construed in accordance with established doctrines of claim interpretation.

What is claimed is:

1. An apparatus comprising:
    a first lens, the first lens including a curved surface and a pattern of photoresist material thereon;
    a second lens bonded with the first lens by the photoresist material between a curved surface of the second lens and the curved surface of the first lens;
    an air gap region between the curved surface of the first lens and the curved surface of the second lens;
    wherein:
        the pattern of photoresist material defines the air gap region between the first lens and the second lens;
        the first lens is a light-guide lens and the second lens is a supporting lens;
        the air gap region forms at least a portion of a light-guide for the apparatus; and
        the air gap region is configured to maintain total internal reflection of light in the first lens.

2. The apparatus of claim 1, wherein the photoresist material defines a height of the air gap region between the first lens and the second lens being between 1 and 50 microns.

3. The apparatus of claim 1, wherein the photoresist material is composed of a negative photoresist material, the photoresist material having been exposed to light to cross-link the negative photoresist material.

4. The apparatus of claim 1, further comprising a third lens coupled with the first lens or the second lens utilizing a second photoresist pattern.

5. The apparatus of claim 1, wherein the apparatus includes head-worn display optics.

6. The apparatus of claim 1, wherein the first lens and second lens are bonded without application of a separate adhesive in addition to the photoresist material.

7. A method including:
    applying a photoresist coating to at least a first curved side of a first lens component of a plurality of lens components;
    applying spatial modulation of light radiation to define which portions of the photoresist coating are exposed to light radiation;
    applying light radiation to the first lens component;
    applying a photoresist developer to dissolve non-exposed portions of the photoresist to generate a photoresist pattern; and
    bonding a first curved side of a second lens component to the first curved side of the first lens component, wherein:
        the first lens component is a light-guide lens and the second lens component is a supporting lens;
        the photoresist pattern is to act as a bonding agent and to define an air gap region between the first curved side of the first lens component and the first curved side of the second lens component; and the second lens component is configured to maintain total internal reflection of light in the first lens component.

8. The method of claim 7, wherein applying the photoresist coating includes applying a negative photoresist material.

9. The method of claim 7, wherein applying the light radiation includes applying UV (ultraviolet) radiation on the exposed photoresist.

10. The method of claim 7, wherein applying spatial modulation includes applying masking to the first lens component prior to application of the light radiation.

11. The method of claim 10, further comprising removing the masking from the first lens component prior to application of the photoresist developer.

12. The method of claim 7, wherein bonding the second lens component to the first lens component includes application of heat and pressure to the first and second lens components.

13. The method of claim 7, wherein bonding the first side of the second lens component to the first side of the first lens component includes bonding to a clean surface of the second lens component.

14. The method of claim 7, further comprising applying a second photoresist pattern to the first side of the second lens component, and wherein bonding the first side of the second lens component to the first side of the first lens component includes at least in part bonding the photoresist pattern to the second photoresist pattern.

15. The method of claim 7, wherein bonding the first side of the second lens component to the first side of the first lens component includes bonding without application of a separate adhesive in addition to the photoresist pattern.

16. A head-worn display optics apparatus comprising:
a multicomponent lens system including:
a plurality of lenses including a waveguide lens component and a supporting lens component, wherein at least a first curved side of the waveguide lens component includes a photoresist pattern; of a photoresist material; and
an air gap region between the waveguide lens component and a curved side of the supporting lens component;
wherein:
the waveguide lens component is bonded with the supporting lens component by the photoresist material;
the air gap region is defined by the photoresist pattern; and
the air gap region and supporting lens component maintain total internal reflection of light in the waveguide lens component.

17. The apparatus of claim 16, wherein the photoresist material is composed of a negative photoresist material, the photoresist material having been exposed to light to crosslink the negative photoresist material.

18. The apparatus of claim 16, wherein the waveguide lens component and the supporting lens component are bonded without application of a separate adhesive in addition to the photoresist material.

19. The apparatus of claim 16, wherein the photoresist material further defines a height of the air gap region.

* * * * *

UNITED STATES PATENT AND TRADEMARK OFFICE
CERTIFICATE OF CORRECTION

PATENT NO. : 10,197,806 B2
APPLICATION NO. : 15/176053
DATED : February 5, 2019
INVENTOR(S) : Omar Negrete

Page 1 of 1

It is certified that error appears in the above-identified patent and that said Letters Patent is hereby corrected as shown below:

In the Claims

At Column 10, Line 8, please correct "pattern; of a photoresist" to be --pattern of a photoresist--

Signed and Sealed this
Twenty-fifth Day of June, 2019

Andrei Iancu
*Director of the United States Patent and Trademark Office*